(12) United States Patent
Sharaf et al.

(10) Patent No.: US 8,897,013 B2
(45) Date of Patent: Nov. 25, 2014

(54) SEALED BATTERY CHARGER HOUSING

(75) Inventors: Nadir Sharaf, Bloomfield Township, MI (US); John M. Van Dyke, Plymouth, MI (US); Richard J. Hampo, Plymouth, MI (US); Slobodan Pavlovic, Novi, MI (US); Rutunj Rai, Canton, MI (US); Reinhard Pusch, Farmington Hills, MI (US)

(73) Assignee: Lear Corporation, Southfield, MI (US)

( * ) Notice: Subject to any disclaimer, the term of this patent is extended or adjusted under 35 U.S.C. 154(b) by 617 days.

(21) Appl. No.: 13/029,432

(22) Filed: Feb. 17, 2011

(65) Prior Publication Data

US 2012/0212175 A1 Aug. 23, 2012

(51) Int. Cl.
 *H05K 7/20* (2006.01)
(52) U.S. Cl.
 CPC ........ *H05K 7/20872* (2013.01); *H05K 7/20272* (2013.01)
 USPC ........... 361/702; 361/699; 361/704; 361/720; 361/721; 165/104.33; 165/185
(58) Field of Classification Search
 USPC ............... 361/679.53, 699, 702, 704, 716, 361/719–721; 165/104.33, 185; 174/252
 See application file for complete search history.

(56) References Cited

U.S. PATENT DOCUMENTS

| | | | |
|---|---|---|---|
| 4,551,787 A * | 11/1985 | Mittal et al. | 361/705 |
| 6,052,284 A * | 4/2000 | Suga et al. | 361/699 |
| 6,156,970 A | 12/2000 | Harting et al. | |
| 6,175,501 B1 * | 1/2001 | Bortolini et al. | 361/720 |
| 6,304,447 B1 * | 10/2001 | Bortolini et al. | 361/699 |
| 6,414,867 B2 | 7/2002 | Suzuki et al. | |
| 6,588,647 B2 * | 7/2003 | Yamada et al. | 228/112.1 |
| 6,594,149 B2 * | 7/2003 | Yamada et al. | 361/699 |
| 6,938,678 B1 * | 9/2005 | Bortolini et al. | 165/80.4 |
| 7,339,788 B2 * | 3/2008 | Olesen et al. | 361/699 |
| 7,835,151 B2 * | 11/2010 | Olesen | 361/689 |
| 8,066,057 B2 * | 11/2011 | Olesen | 165/80.4 |
| 8,072,758 B2 * | 12/2011 | Groppo et al. | 361/703 |
| 8,302,408 B2 * | 11/2012 | Miki | 62/3.3 |
| 8,339,785 B2 * | 12/2012 | Chang et al. | 361/699 |
| 8,472,188 B2 * | 6/2013 | Horiuchi et al. | 361/699 |
| 2003/0178179 A1 | 9/2003 | Brost | |
| 2007/0230127 A1 | 10/2007 | Peugh et al. | |
| 2007/0236883 A1 | 10/2007 | Ruiz | |
| 2008/0225482 A1 | 9/2008 | Smith et al. | |
| 2008/0236805 A1 * | 10/2008 | Miki | 165/185 |
| 2008/0285230 A1 | 11/2008 | Bojan et al. | |
| 2010/0025126 A1 | 2/2010 | Nakatsu et al. | |
| 2010/0097765 A1 | 4/2010 | Suzuki et al. | |
| 2010/0208427 A1 * | 8/2010 | Horiuchi et al. | 361/699 |

(Continued)

OTHER PUBLICATIONS

"Wax Enhanced Thermal Interface and Application Process", IBM Technical Disclosure Bulletin, Sep. 1978, 3 pages.*

(Continued)

*Primary Examiner* — Robert J Hoffberg
(74) *Attorney, Agent, or Firm* — Brooks Kushman P.C.

(57) ABSTRACT

A housing or other enclosure used to facilitate fluid cooling of a circuitry of a battery charger, such as but not limited to a battery charger of the type used to facilitate charging a high voltage vehicle battery with AC energy provided from a utility power grid. The housing may include a groove and seal arrangement operable to seal a fluid coolant chamber used to cool the circuitry from leaking fluid during use.

16 Claims, 4 Drawing Sheets

(56) References Cited

U.S. PATENT DOCUMENTS

2011/0188204 A1* 8/2011 Horiuchi et al. ............. 361/702
2011/0232864 A1* 9/2011 Zaffetti ....................... 165/80.4
2013/0044434 A1* 2/2013 Sharaf et al. ................. 361/702

OTHER PUBLICATIONS

"Parker O-Ring Handbook", Parker Hannifin Corporation, O-Ring Division, ORD 5700, Jul. 2007, 292 pages.*

* cited by examiner

SEALED BATTERY CHARGER HOUSING

TECHNICAL FIELD

The present invention relates to sealing a housing or other enclosure used to facilitate fluid based cooling of circuitry, such as but not limited to circuitry associated with a battery charger of the type used to facilitate charging a high voltage vehicle battery with AC energy sourced from a utility power grid.

BACKGROUND

The ability to seal a housing against fluid leakage, whether the fluid is a liquid or a gas, can be important to preventing electronic devices and components from being harmfully exposed to the fluid. While not intending to necessarily limit the scope and contemplation of the present invention, the present invention is, for exemplary purposes, predominately described with respect to sealing a housing associated with a vehicle battery charger since the design of such a charger is particularly constrained by automotive dictated space, weight, and positional restrictions that tend to limit the amount of space available to place drainage holes and other auxiliary leakage control features relative to a cooling chamber or other area used to facilitate flowing the cooling liquid relative to circuit assemblies or other to be cooled elements.

SUMMARY

One non-limiting aspect of the present invention relates to a housing for use in cooling first and second circuit assemblies with a fluid, the housing comprising: a first coldplate having a top side operable to receive the first circuit assembly; a second coldplate having a bottom side operable to receive the second circuit assembly; a fluid cooling chamber through which the fluid flows to cool the first and second circuit assemblies, the fluid cooling chamber being sealed with a bottom side of the first coldplate adjoining with an top side of the second coldplate; a groove within the second coldplate around an entire outer perimeter of the fluid cooling chamber, the groove having a substantially uniform depth throughout the entire outer perimeter; and a seal positioned within the groove around the entire outer perimeter of the fluid cooling chamber to prevent fluid leakage.

One non-limiting aspect of the present invention relates to the bottom side of the first coldplate compacting the seal into the groove when adjoined to the second coldplate.

One non-limiting aspect of the present invention relates to the first coldplate proximate the groove being planar across a width of the groove around the entire outer perimeter, the first portion contacting the top side of the second coldplate proximate both lateral sides of the groove when the first coldplate is adjoined to the second coldplate.

One non-limiting aspect of the present invention relates to at least one fastening element operable to secure the first coldplate to the second coldplate with a compressive force, thereby causing the bottom side of the first coldplate to adjoin the top side of the second coldplate.

One non-limiting aspect of the present invention relates to a depth of the groove being between 0.5-5 mm throughout.

One non-limiting aspect of the present invention relates to a height of the seal being at least one of between 0.7-7 mm greater than the depth of the groove and 70% larger than the depth of the groove.

One non-limiting aspect of the present invention relates to each of the first and second coldplates included at least one aperture through which one or more wires pass to establish a corresponding one or more direct electrically connections between the first and second circuit assemblies.

One non-limiting aspect of the present invention relates to an aperture groove within the second coldplate being around an entire outer perimeter of each of the one or more apertures and an aperture seal positioned entirely within each aperture groove to prevent fluid leakage.

One non-limiting aspect of the present invention relates to: the bottom side of the first coldplate compacts each aperture seal into the corresponding aperture groove when adjoined to the second coldplate; each portion of the first coldplate proximate the aperture grooves is planar across a width of the aperture grooves, the portions contacting the top side of the second coldplate proximate both lateral sides of the aperture grooves when the first coldplate is adjoined to the second coldplate; and at least one fastening element operable to secure the first coldplate to the second coldplate with a compressive force, thereby causing the bottom side of the first coldplate to adjoin the top side of the second coldplate with the compressive force being sufficient to entirely compact each aperture seal within the corresponding aperture groove.

One non-limiting aspect of the present invention relates to at least one of the one or more apertures are included interior to the outer perimeter of the fluid cooling chamber.

One non-limiting aspect of the present invention relates to substantially all of a cavity defining the fluid cooling chamber being recessed below the top side of the second coldplate and includes a plurality of discrete partitions to direct fluid flow from an inlet to an outlet.

One non-limiting aspect of the present invention relates to a plurality of cooling fins extending from the bottom side of the first coldplate into the cavity below the top side of the second coldplate.

One non-limiting aspect of the present invention relates to a battery charger housing having at least first and second circuit assemblies operable to convert AC energy from a utility power grid to DC energy sufficient for charging a high voltage vehicle battery, the first and second circuit assemblies requiring an electrical interconnection to coordinate control required to convert the AC energy to the DC energy, the housing comprising: a first coldplate operable to receive the first circuit assembly; a second coldplate operable to receive the second circuit assembly; a fluid cooling chamber defined substantially within the second coldplate through which the fluid flows to cool the first and second circuit assemblies; apertures within each of the first and second coldplates through which a connector extends to create the electrical interconnection between the first circuit assembly and the second circuit assembly; a fluid cooling chamber groove within the second coldplate around an entire outer perimeter of the fluid cooling chamber; a fluid cooling chamber seal positioned within the fluid cooling chamber groove around the entire outer perimeter of the fluid cooling chamber to prevent fluid leakage; an aperture groove within the second coldplate around an entire outer perimeter of the aperture; and an aperture seal positioned within the fluid cooling chamber groove around the entire outer perimeter of the fluid cooling chamber to prevent fluid leakage.

One non-limiting aspect of the present invention relates to each of the fluid cooling chamber seal and the aperture seal being compressed entirely within the corresponding fluid cooling chamber groove and the aperture groove when the first coldplate adjoins the second coldplate.

One non-limiting aspect of the present invention relates to the aperture being interior to the outer perimeter of the fluid cooling chamber.

One non-limiting aspect of the present invention relates to each of the aperture groove and the fluid cooling chamber groove having the same, uninterrupted cross-sectional profile throughout.

One non-limiting aspect of the present invention relates to a housing cooled with a fluid comprising: a first coldplate; a second coldplate; a fluid cooling chamber through which the fluid flows to cool the first and second coldplates, the fluid cooling chamber being sealed with a bottom side of the first coldplate adjoining with an top side of the second coldplate; a groove within the second coldplate around an entire outer perimeter of the fluid cooling chamber, the groove being free of drainage holes; and a seal positioned within the groove around the entire outer perimeter of the fluid cooling chamber to prevent fluid leakage.

One non-limiting aspect of the present invention relates to the seal and the groove being the only seal and groove combination entirely surrounding the fluid cooling chamber.

One non-limiting aspect of the present invention relates to the seal compacting into the groove to entirely fill all areas exposed within the groove with sealing material.

One non-limiting aspect of the present invention relates to the housing including: apertures within each of the first and second coldplates through which a connector is operable to extend to create a connection between a first circuit assembly secured to the first coldplate and a second circuit assembly secured to the second coldplate; an aperture groove within the second coldplate around an entire outer perimeter of the aperture; and an aperture seal positioned within the fluid cooling chamber groove around the entire outer perimeter of the fluid cooling chamber to prevent fluid leakage.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
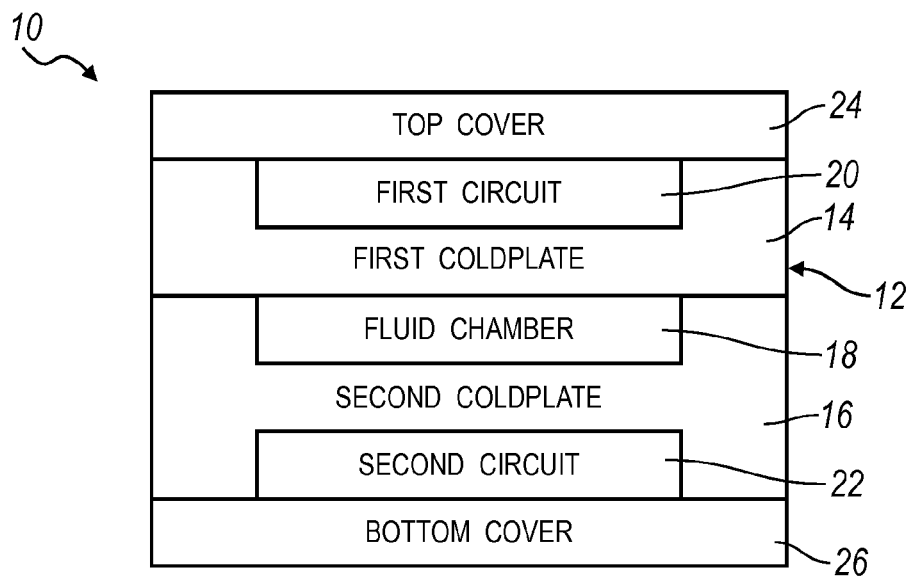
FIG. 1 schematically illustrates a layered construction of a battery charger having a housing as contemplated by one non-limiting aspect of the present invention.

FIG. 1 schematically illustrates a layered construction of a battery charger 10 having a housing 12 as contemplated by one non-limiting aspect of the present invention. The housing 12 includes a first coldplate 14 secured to a second coldplate 16 in a manner that defines a fluid cooling chamber 18 or passage operable to facilitate cooling of first and second circuit assemblies 20, 22, which may be circuit assemblies 20, 22 of any type and having any number of electronic components and processors, including but not limited to assembles having electronics operable to facilitate converting AC energy source from a utility grid (not shown) to DC energy sufficient to facilitate charging a high voltage vehicle battery (not shown) used to provide energy for propelling an electric or hybrid electric vehicle (not shown). The housing 12 may further include top and bottom covers 24, 26 to respectively enclose top and bottom sides of the first and second coldplates 14, 16, such as to prevent dust, fluid, and other debris from being exposed to the first and second circuit assemblies 20, 22.

Figure 2A:
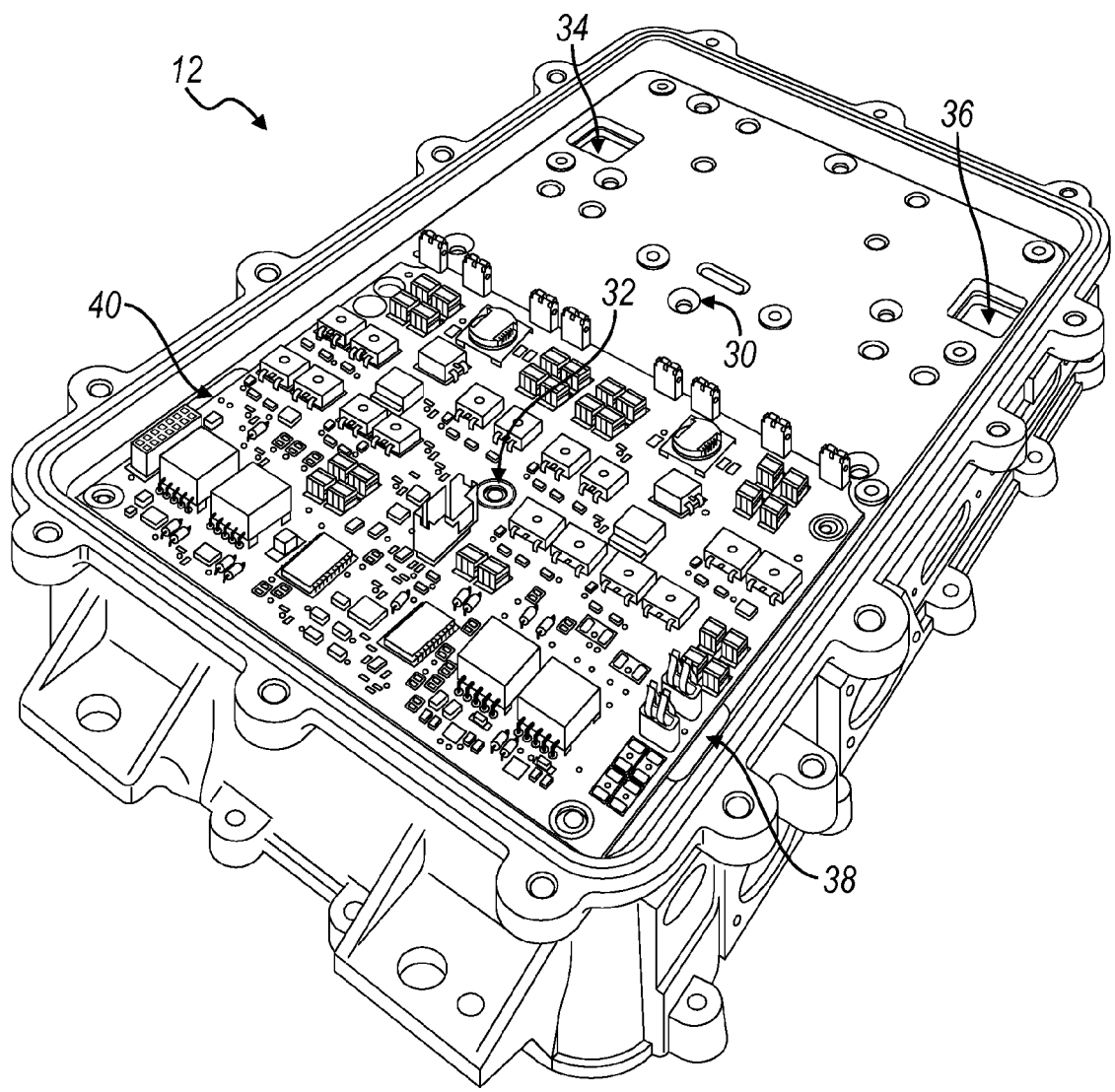
FIGS. 2A-2B respectively illustrate top and bottom views of a housing in accordance with one non-limiting aspect of the present invention.
Figure 2B:
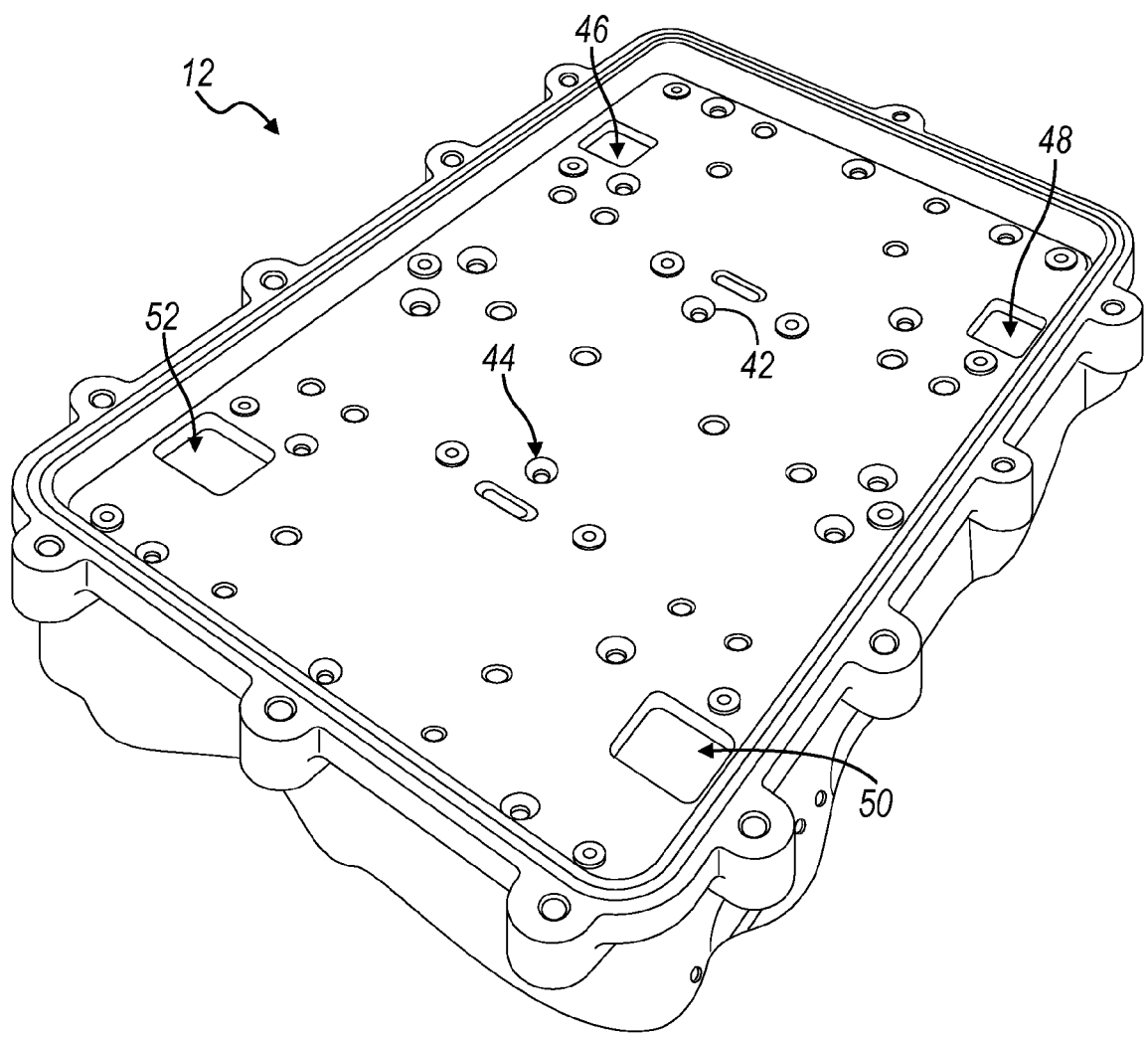

FIGS. 2A-2B respectively illustrate top and bottom views of the housing 12 with the top and bottom covers 24, 26 being removed and the first and second circuit assemblies 20, 22 partially filling the top and bottom sides of the first and second coldplates 14, 16. The circuits 20, 22 are generically shown as being comprised of electronics mounted on a single printed circuit board (PCB) for exemplary purposes. The present invention contemplates the use of any number of PCBs and/or electronics and the PCB occupying more of the top and bottom sides. The circuit assemblies 20, 22 may include a processor, controller, or other element that requires communication with one or more of the components on the other assembly, such as to facilitate the controlling the contemplated battery charging operations.

Each of the top and bottom sides may include through-hole apertures 30, 32 that align with recesses 42, 44 (recesses 42, 44, do not extend through bottom of second coldplate 16) to facilitate fastening the first and second coldplates 14, 16 together and additional through-holes, 34, 36, 38, 40, 46, 48, 50, 52 through which a connector, wire, or other electrically conducting element (not shown) may pass from the top side of the first coldplate 14 through to the bottom side of the second coldplate 16 to establish an electrical interconnection between each circuit assembly 20, 22. The second coldplate 16 is also shown in include a plurality of side-wall apertures 58, 60, 62, 64 (see FIG. 3) through which cables, wires, and/or other connectors may project. One or more of these connectors may be used to connect the battery charger 10 to an AC source and to provide the DC output to the high voltage vehicle battery or other element or subsystem within the vehicle.

Figure 3:
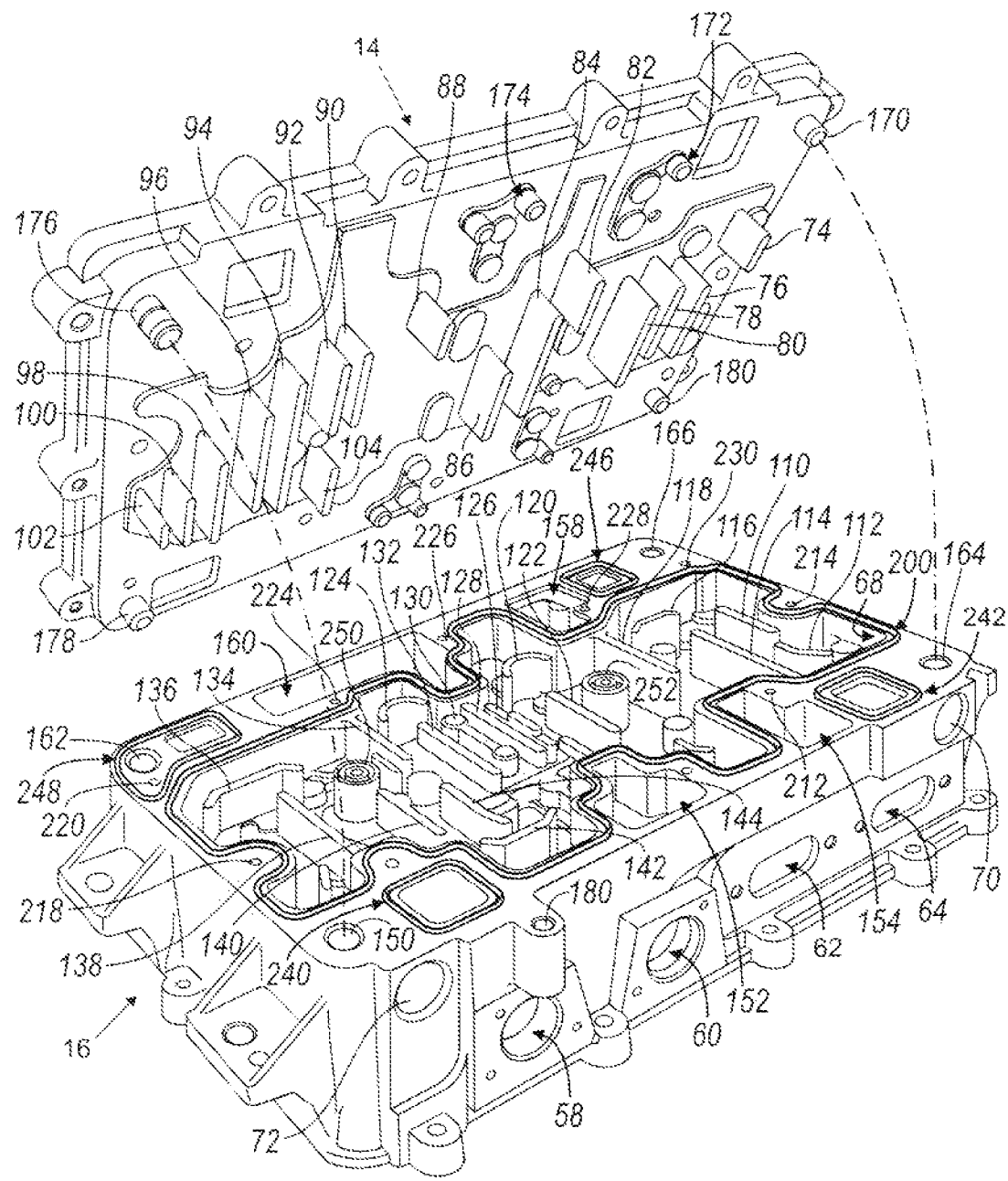
FIG. 3 illustrates a partial assembly view of the housing in accordance with one non-limiting aspect of the present invention.

FIG. 3 illustrates a partial assembly view of the housing 12 with exposure of a bottom side of the first coldplate 14 and a top side of the second coldplate 16. A cavity 68 formed with the second coldplate forms the flood cooling chamber 18 through which a fluid, such as a liquid or gas, flows between an inlet 70 and an outlet 72 to facilitate cooling of the first and second coldplates 14, 16, and thereby the first and second circuit assemblies 20, 22. A number of fins 74, 76, 78, 80, 82, 84, 86, 88, 90, 92, 94, 96, 98, 100, 102, 104 may extend from the bottom side of the first coldplate 14 below the top side of the second coldplate 16 and into the cavity 68 to further facilitate the contemplated cooling. A plurality of partitions or dividers 110, 112, 114, 116, 118, 120, 122, 124, 126, 128, 130, 132, 134, 136, 138, 140, 142, 144 may similarly extend upwardly from a bottom of the cavity 68 to facilitate directing the fluid flow between the inlet 70 and outlet 72. The second coldplate 16 may also include a plurality of reliefs 150, 152, 154, 156, 158, 160, 162, 164, 166 that align with a corresponding plurality of extensions 170, 172, 174, 176, 178, 180, 182, 184, 186 of the first coldplate 14. Screws may be threaded into the extensions 170, 172, 174, 176, 178, 180, 182, 184, 186 without passing through a bottom side thereof to facilitate securing the PCB 20 to the first coldplate 14.

Figure 4A:
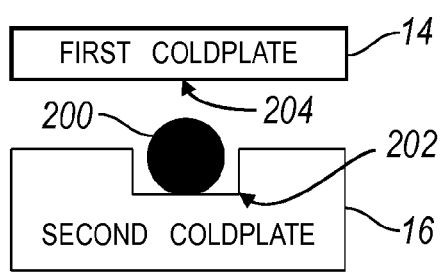
FIGS. 4A and 4B illustrate operation of the seal and groove in accordance with one non-limiting aspect of the present invention.
Figure 4B:
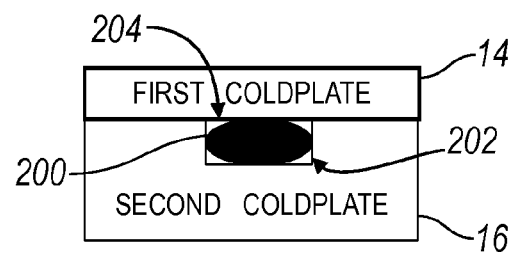

A seal 200 may be positioned within a groove 202 around an entire outer perimeter of the fluid cooling chamber 68 to prevent fluid leakage. FIGS. 4A and 4B illustrate operation of the seal and groove in accordance with one non-limiting aspect of the present invention where the seal 200 may be substantially cylindrically shaped and compacts into the groove 202 when the first coldplate 14 adjoins with the second coldplate 16. A compressive force between the first and second coldplates 14, 16 may be sufficient to compact the seal 200 flush against planar portion 204 of the first coldplate 14 that extends across the groove 202 from one side to the other. As shown in FIG. 3, the first and second coldplates may be secured together with one or more fasteners (not shown) or other securing agents being inserted through one or more receptacles 210, 212, 214, 216, 218, 220, 222, 224, 226, 228, 230 to provide the compressive action shown in FIGS. 4A-4B.

The compressive force may be sufficient to generate a metal to metal contact between the first and second coldplates 14, 16, or a similar material to material interface in the event to coldplates 14, 16 are comprised of a ceramic, plastic, or other material. The illustrated groove 202 is shown be rectangular with a depth of 2.2 mm and a width of 2.5 mm throughout relative to an approximate 2.8 mm diameter of the seal 200. The difference between the seal diameter and the seal groove depth may be select as a function of the seal material (rubber, plastic, etc.) and the shape of the corresponding groove 202 as required to allow the seal 200 to be sufficiently compacted to provide the desired fluid leakage resistance. Additional seal and groove conditions may be included around the through-hole apertures 42, 44, 46, 48, 50, 52 and constructed in a similar manner.

The grooves and seals 200, 202, 240, 246, 248, 250, 252 may be uniform throughout at least in so far as having the same, uninterrupted profile where a bottom of each groove is free of a drainage hole or other feature to control fluid flow. Of course, the present invention fully contemplates the grooves 202, 240, 242, 246, 248, 250, 252 including drainage holes and/or the use of drainage holes proximate the grooves 202, 240, 242, 246, 248, 250, 252, such as holes shaped to borough though the second coldplate 16 to a collecting area away from the first and second circuit assemblies 20, 22. One non-limiting aspect of the present contemplates a design free of drainage holes and other auxiliary fluid control features in order to provide a compact configuration free of the extra space needed to shape such auxiliary fluid control features and to limit the amount of work required to form and/or cut the coldplates 14, 16 to include such auxiliary fluid control features. The present invention fully contemplates the seals and/or grooves 202, 240, 242, 246, 248, 250, 252 having non-spherical shapes, such as but not limited to being square, double-humped, etc.

As supported above, one non-limiting aspect of the present invention contemplates sealing for a coolant passage within an electronic module that contains a coolant passage in the center of the package with electronics mounted on both sides of the coolant passage. The illustrated configurations are believed, at least on some respects, to be beneficial in that if the seal around the outer perimeter of the coolant passage were to fail the coolant would not likely come in contact with the electronics due to the additional seals being separately included around the through-hole apertures, which may be particularly helpful since a coolant leak to the electronics may go undetected until protection circuit shutdown or module failure. The present invention contemplates selecting the location of the coolant seal such that if the seal were to fail the coolant leaks to the outside of the electronics housing, thus keeping the coolant away from the electronics within the assembly. Also, since the coolant leaks to the outside of the module the opportunity for detection is increased.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A housing for use in cooling first and second circuit assemblies with a fluid, the housing comprising:
    a first coldplate having a top side operable to receive the first circuit assembly;
    a second coldplate having a bottom side operable to receive the second circuit assembly;
    a fluid cooling chamber through which the fluid flows to cool the first and second circuit assemblies, the fluid cooling chamber formed by a bottom side of the first coldplate and a top side of the second coldplate when the first and second coldplates are adjoined;
    a fluid cooling chamber groove within the second coldplate around an entire outer perimeter of the fluid cooling chamber, the fluid cooling chamber groove having a substantially uniform depth throughout the entire outer perimeter; and
    a fluid cooling chamber seal operable to prevent fluid leakage when positioned within the fluid cooling chamber groove;
    wherein each of the first and second coldplates has an aperture formed therein, the apertures of the first and second coldplates configured to cooperate to permit at least one wire to pass through the first and second coldplates to establish an electrical connection between the first and second circuit assemblies when the first and second coldplates are adjoined.

2. The housing of claim 1 wherein the bottom side of the first coldplate compacts the fluid cooling chamber seal into the fluid cooling chamber groove when adjoined to the second coldplate.

3. The housing of claim 2 wherein a first portion of the first coldplate proximate the fluid cooling chamber groove is planar across a width of the fluid cooling chamber groove around the entire outer perimeter of the fluid cooling chamber, the first portion contacting the top side of the second coldplate proximate both lateral sides of the fluid cooling chamber groove when the first coldplate is adjoined to the second coldplate.

4. The housing of claim 3 further comprising at least one fastening element operable to secure the first coldplate to the second coldplate with a compressive force, thereby causing the bottom side of the first coldplate to adjoin the top side of the second coldplate.

5. The housing of claim 1 wherein a depth of the fluid cooling chamber groove is between 0.5-5 mm throughout.

6. The housing of claim 1 further comprising an aperture groove within the second coldplate, the aperture groove formed around an entire outer perimeter of the aperture of the second coldplate, and an aperture seal operable to prevent fluid leakage when positioned within the aperture groove.

7. The housing of claim 6 wherein:
the bottom side of the first coldplate compacts the aperture seal into the aperture groove when adjoined to the second coldplate;
a portion of the first coldplate proximate the aperture groove is planar across a width of the aperture groove, the portion contacting the top side of the second coldplate proximate both lateral sides of the aperture groove when the first coldplate is adjoined to the second coldplate; and
at least one fastening element operable to secure the first coldplate to the second coldplate with a compressive force, thereby causing the bottom side of the first coldplate to adjoin the top side of the second coldplate with the compressive force being sufficient to compact the aperture seal within the aperture groove.

8. The housing of claim 7 wherein the apertures are located in the first and second coldplates outside an area bounded by the outer perimeter of the fluid cooling chamber.

9. The housing of claim 1 wherein substantially all of a cavity defining the fluid cooling chamber is recessed below the top side of the second coldplate and includes a plurality of discrete partitions to direct fluid flow from an inlet to an outlet.

10. The housing of claim 9 further comprising a plurality of cooling fins extending from the bottom side of the first coldplate into the cavity below the top side of the second coldplate.

11. A battery charger housing having the first and second circuit assemblies operable to convert AC energy from a utility power grid to DC energy sufficient for charging a high voltage vehicle battery, the first and second circuit assemblies requiring an electrical interconnection to coordinate control required to convert the AC energy to the DC energy, the housing comprising:
a first coldplate operable to receive the first circuit assembly;
a second coldplate operable to receive the second circuit assembly;
a fluid cooling chamber defined substantially within the second coldplate through which a fluid flows to cool the first and second circuit assemblies;
wherein each of the first and second coldplates has an aperture formed therein, the apertures of the first and second coldplates configured to cooperate to permit a conductor to extend through the first and second coldplates to create the electrical interconnection between the first circuit assembly and the second circuit assembly when the first and second coldplates are adjoined;
a fluid cooling chamber groove within the second coldplate around an entire outer perimeter of the fluid cooling chamber;
a fluid cooling chamber seal operable to prevent fluid leakage when positioned within the fluid cooling chamber groove around the entire outer perimeter of the fluid cooling chamber;
an aperture groove within the second coldplate around an entire outer perimeter of the aperture of the second coldplate; and
an aperture seal operable to prevent fluid leakage when positioned within the aperture groove.

12. The housing of claim 11 wherein the fluid cooling chamber seal compresses within the fluid cooling chamber groove and the aperture seal compresses within the aperture groove when the first coldplate adjoins the second coldplate.

13. The housing of claim 11 wherein the aperture within each of the first and second coldplates is located in the first and second coldplates outside an area bounded by the outer perimeter of the fluid cooling chamber.

14. The housing of claim 11 wherein each of the aperture groove and the fluid cooling chamber groove have the same, uninterrupted cross-sectional profile throughout.

15. A housing cooled with a fluid comprising:
a first coldplate operable to receive a first circuit assembly;
a second coldplate operable to receive a second circuit assembly;
a fluid cooling chamber through which the fluid flows to cool the first and second coldplates, the fluid cooling chamber formed by a bottom side of the first coldplate and a top side of the second coldplate when the first and second coldplates are adjoined;
a fluid cooling chamber groove within the second coldplate around an entire outer perimeter of the fluid cooling chamber, the fluid cooling chamber groove being free of drainage holes;
a fluid cooling chamber seal operable to prevent fluid leakage when positioned within the fluid cooling chamber groove;
wherein each of the first and second coldplates has an aperture formed therein, the apertures of the first and second coldplates configured to cooperate to permit a conductor to extend through the first and second coldplates to create a connection between the first circuit assembly and the second circuit assembly when the first and second coldplates are adjoined;
an aperture groove within the second coldplate around an entire outer perimeter of the aperture of the second coldplate; and
an aperture seal operable to prevent fluid leakage when positioned within the aperture groove.

16. The housing of claim 15 wherein the fluid cooling chamber seal compacts into the fluid cooling chamber groove to fill an area exposed within the fluid cooling chamber groove with sealing material of the fluid cooling chamber seal.

* * * * *